(12) United States Patent
Chadha et al.

(10) Patent No.: US 7,051,299 B2
(45) Date of Patent: May 23, 2006

(54) METHOD FOR GENERATING REUSABLE BEHAVIORAL CODE

(75) Inventors: Sundeep Chadha, Austin, TX (US); Maureen Terese Davis, Austin, TX (US); Sudhi Ranjan Proch, Austin, TX (US); Tony Emile Sawan, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 10/631,536

(22) Filed: Jul. 31, 2003

(65) Prior Publication Data

US 2005/0028035 A1 Feb. 3, 2005

(51) Int. Cl.
*G06F 17/50* (2006.01)

(52) U.S. Cl. .................................. 716/4; 716/5; 716/18
(58) Field of Classification Search ............... 716/4–5, 716/18; 714/25–46, 724–745
See application file for complete search history.

(56) References Cited

U.S. PATENT DOCUMENTS 5,995,736 A * 11/1999 Aleksic et al. ............... 716/18
6,530,054 B1 * 3/2003 Hollander ..................... 714/739

* cited by examiner

*Primary Examiner*—Vuthe Siek
(74) *Attorney, Agent, or Firm*—Carr LLP; Diana R. Gerhardt

(57) ABSTRACT

A waveform viewer implemented method of generating and manipulating user specified language simulation code such that an integrated circuit digital design can be modified. The visual capabilities of the waveform viewer allow a plurality of inputs for processing. The previous test's user specified language lines and the original signal waveforms are viewable on the same screen as the new code lines and waveforms. The waveform viewer also displays the contents of the portable reusable code portable reusable coded storage device. Each line of code and every signal can be manipulated by the user within the waveform viewer. The modified code output is applied to the test sequence through the waveform viewer, and the integrated circuit is retested with the new code. After modifications to the integrated circuit are complete, the proved device's stored user specified language can be transported to and inserted in other device architectures.

22 Claims, 4 Drawing Sheets

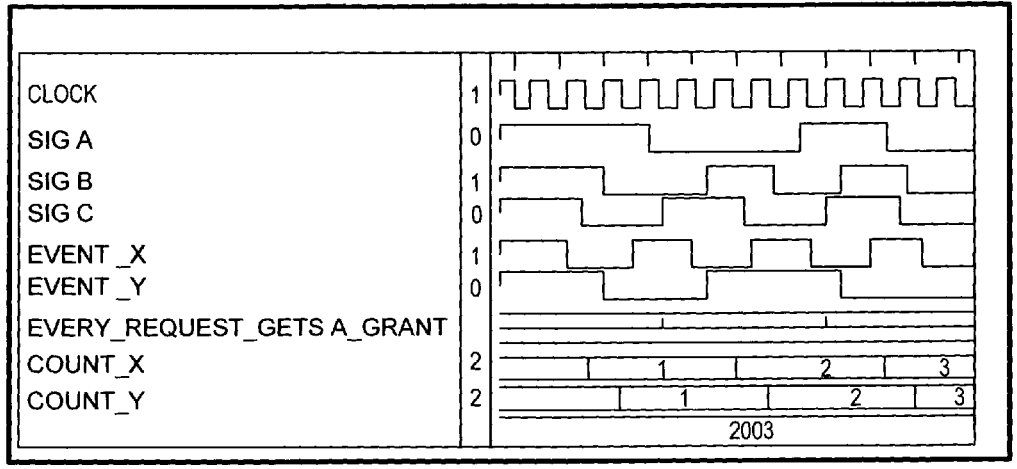

FIG. 3

| DUT ORIGINATION CODE | ABCMG OUTPUT CODE |
|---|---|
| MODULE SIM_MONITOR_1 (SIGA, SIGB, CLOCK)<br>INPUT SIGA, SIGB, CLOCK;<br>OUTPUT EVENT_X, EVENT_Y;<br>REG EVENT_X, EVENT_Y;<br>REG [0:31] COUNT_X, COUNT_Y;<br>ALWAYS @(SIGA OR SIGB) BEGIN<br> EVENT_X = SIGA\|SIGB;<br>END<br><br>ALWAYS @(POSEDGE CLOCK) BEGIN<br> EVENT_Y <=~EVENT_X<br>END<br><br>ALWAYS @ (EVENT_X OR EVENT_Y) BEGIN<br> COUNT_X=COUNT_X+1;<br> COUNT_Y=COUNT_Y+1;<br>ALWAYS @(POSEDGE CLOCK) BEGIN<br> EVENT_Z = (COUNT_Y <= COUNT_X)<br>END<br>ENDMODULE //SIM_MONITOR1 | TESTBENCH<br><br>MODULE TOP 0<br><br>...<br><br>SIM_MONITOR_1XY_MONITOR<br>(SIGA, SIGB, CLOCK, EVENT_X,<br>EVENT_Y);<br><br>  EXEMPLARY CODE LINE FOR X<br><br>  EXEMPLARY CODE LINE FOR Y<br><br>  EXEMPLARY CODE LINE FOR ASSERT_Z<br><br>  EXEMPLARY CODE LINE FOR COUNT_W |

FIG. 4

METHOD FOR GENERATING REUSABLE BEHAVIORAL CODE

TECHNICAL FIELD

The invention relates generally to the use of user specified language (USL) for creating digital circuit designs and, more particularly, to the generation of USL for application specific integrated circuits (ASICs), field programmable gate arrays (FPGAs) and systems on a chip (SoCs).

BACKGROUND

In conventional systems, coding of events, monitors, assertions, properties and checkers for digital circuits is a complicated process. Generally, these systems are comprised of ASICs (application specific integrated circuits), FPGAs (field programmable gate arrays) and SoCs (system on chips).

Initially, designers could design integrated circuits at the gate level. In other words, the designers would determine the particular arrangement and interconnection of logic gates (for example, NOT, OR, AND, NAND or NOR gates) which would achieve the desired functionality. The physical layout of the logic gates could then be determined and the corresponding physical device constructed.

As the size and complexity of integrated circuits (IC) has increased, various tools have been developed to assist designers in their work. For example, a USL waveform viewer shows signal values over time periods. The waveform viewer is also capable of displaying the associated USL code that generates these signals. This displayed code can be recoded, manually, as the test proceeds, or after the test is completed, for the next series of tests.

A further purpose of using a test bench is to determine the impact of signal inputs on the signal outputs. The visual medium of the USL waveform viewer substantially raises the gate level abstractive design. The abstractive design is the IC gating model. That is, greater complexity can be developed with a more visually complex review mechanism (the waveform viewer) than with other methods of design expression. The design process is simplified because the waveform viewer method is more intuitive than other methods. Intuitive methods of hardware design are generally faster. Usually USL waveform viewers are passive devices displaying signal inputs and outputs. In some designs, a limited quantity of discrete manipulation of individual source signal inputs is possible.

However, as circuit design geometrically increases in complexity and design, the sheer number of elements, even for repetitive use gates, requires substantial amounts of manual coding resources. This necessarily leads to longer product development cycles and higher unit costs.

At the behavioral level, a circuit or sub-component of a circuit can be described in terms of the inputs to the circuit, the outputs from the circuit, and the processes which are performed by the circuit, thereby transforming the input signals into the output signals. The behavioral characterization of the circuit is normally provided through a USL software component.

A USL behavioral description is coded software of how a digital system works. This description is essentially a "black box" with a certain set of inputs and a certain set of outputs. The manner in which the outputs are generated from the inputs is described functionally, but not in terms of the specific arrangement of logic gates within the IC under development. The USL behavioral description is transformed into a gate level structural description of the circuit by a synthesis tool. The synthesis tool reads the USL behavioral description and generates a corresponding description which consists of a list of logic gates and the interconnections between the gates.

The development of increasingly sophisticated developer toolkits contained within waveform viewer test benches (the physical and logical device that connects the integrated circuit to the test inputs and results outputs) has not come with a parallel increase in lessening the demands of manual coding. Generally, input signals are not compared to each other, only to the output signals displayed in a waveform viewer or some other display means. The outputs are always derived from inputs made to the subject device through a test bench process. In other words, each design, from the gate-level upward, requires completely fresh coding, though the essential function remains the same.

USL code was specifically developed for advanced generation IC design. The USL languages contain greater amounts of information in fewer lines of code. This is particularly important as the complexity of digital circuits requires increasing the number of processor instruction sets. Fewer lines of code also reduce the number of errors in the total code.

Although the code language is more sophisticated, and results in less code density, it is necessary to have a better means of identifying which line of code affects what part of the gate design. Faster identification of the erroneous code at the beginning of the instruction set or routine leads to fewer subsequent errors. It also requires a lower number of test bench simulations on the device.

Present USL waveform viewers are unable to show all of the inputs and outputs from the integrated circuit in the test bench. The waveform viewers typically contain no possibility of modifying the device inputs in a real-time (i.e., as the test is conducted) mode, requiring the device to be removed and restructured for additional testing. Therefore, there is a need for a USL waveform viewer that overcomes at least some of the disadvantages associated with conventional USL waveform viewers.

SUMMARY OF THE INVENTION

The present invention provides for the automatic generation of USL coding by collecting and interpreting a plurality of stimulation results or test stimuli as generated in a visual display test apparatus.

BRIEF DESCRIPTION OF THE DRAWINGS

For a more complete understanding of the present invention, and the advantages thereof, reference is now made to the following Detailed Description taken in conjunction with the accompanying drawings, in which:

FIG. 3 illustrates simulation waveform viewer output waveforms and code lines in one embodiment of the invention;

FIG. 4 is an example of hand coded user specified language for assertion and event monitors.

DETAILED DESCRIPTION

In the following discussion, numerous specific details are set forth to provide a thorough understanding of the present invention. However, those skilled in the art will appreciate that the present invention can be practiced without such specific details. In other instances, well-known elements have been illustrated in schematic or block diagram form in order not to obscure the present invention in unnecessary detail. Additionally, for the most part, details concerning digital input signaling, portable storage media, and the like, have been omitted since such details are not considered necessary to obtain a complete understanding of the present invention, and are considered to be within the understanding of persons of ordinary skill in the relevant art.

It is further noted that, unless indicated otherwise, all functions described herein can be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Hardware description languages (HDLs) can be used in the design process. HDLs are specifically designed to provide a means for specifying the behavior of a digital system or design at various levels of abstraction. HDLs have evolved into two standards, Verilog and VHDL. Alternate user specified languages include C and Sugar. C and Sugar are alternative coding languages that can be used for HDL since they are in more wide spread use in IC development industries.

Figure 1:
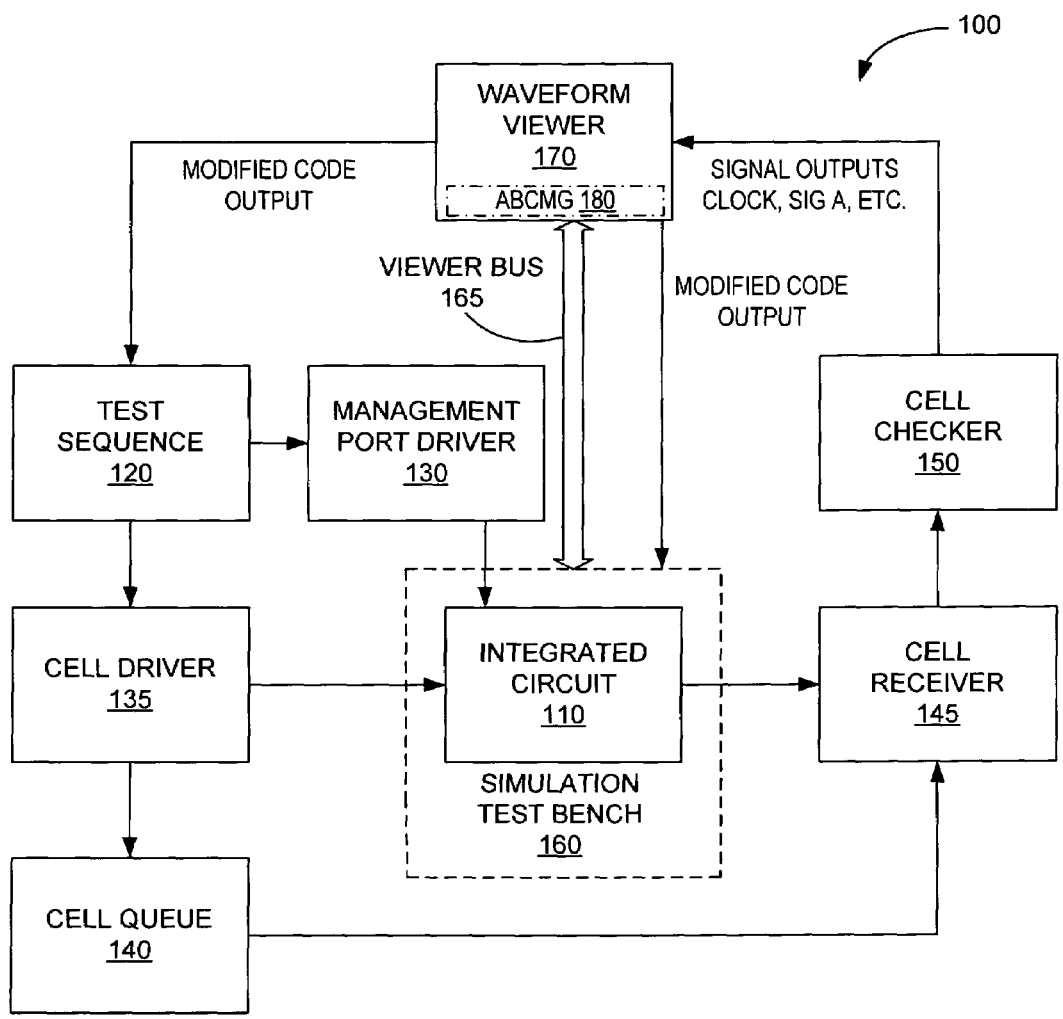
FIG. 1 is an example of a device test bench structure system.

Turning to FIG. 1, disclosed is a test bench structure system 100. An integrated circuit (IC) 110 is connected to the simulation test bench 160. The test bench 160 is a platform for holding an integrated circuit in a stabilized environment (temperature, pressure, humidity and similar parameters). The simulation test bench can also contain electrical or mechanical apparatus for affixing the IC 110 to a plurality of inputs and outputs. The test bench is coupled by means of a plurality of cell driver 135 devices affixed by an optical, electrical or mechanical means to the test device. The test sequence 120 is generally coupled, in a parallel configuration, to a management port driver 130.

The cell queue 140 is connected to one or more cell driver 135 and then to a cell checker 150. The outputs from the IC 110 are physically connected to cell receiver 145 devices and connected in parallel with the cell checker 150 (which itself is connected serially to cell queue 140).

The cell checker 150 is then connected serially to the waveform viewer 170. Visual code is displayed on the waveform viewer 170 and modified code lines are inserted in various software routines in the programming structure of the test sequence 120 or the simulation test bench 160.

Usually, a system port driver is a specific gateway that sends communication and operation signals to discrete subsystems such as a printer driver or a modem driver. The cell driver is a logical gate device applying signals from the test sequence 120 to the IC gate nodes or ports. A test sequence 120 issues a series of command control instructions initiated by a low level code sequencing program residing in the preprogrammed memory of the test sequence 120.

The purpose of the test sequence 120 is to send signals derived from the preprogrammed code (or the modified waveform viewer 170 code) for testing a specific variety of device hardware functions. The test sequence 120 is divided into a plurality of sections that can function independently in selecting one or more management port driver 130 devices or cell driver 135 devices.

The management port driver 130 devices and the cell driver 135 devices pass the correct signals to the nodes on the IC 110. These inputs are matched exactly to cell receiver 145 devices that pass the output signals to a cell checker 150. Simultaneously, the cell queue 140 takes reference signal inputs from cell driver 135 caches and subsequently deposits them in the cell checker 150. The purpose of the cell checker 150 is to cache, verify and compare the output signals of cell receiver 145 devices with the reference input signals from cell driver 135 devices. This comparison provides for a quality control check to insure that the IC 110 receives the designed test values.

In the remainder of this description, the waveform viewer 170 can be the sole display of visual output for user specified language (USL) in a system. In such a situation, the waveform viewer 170 is electrically coupled to the signal output of cell checker 150, the waveform viewer bus 165, and the modified code is output to test sequence device 120 or the simulation test bench 160. There can also be a plurality of test cases or test suites that share the test bench according to some methodology or algorithm developed for a given digital design. The additional test cases are stand-alone programs, or plug-ins, designed to test devices connected to the integrated circuit 110. That is, the test bench can be modified to accept a plurality of other devices acting on the integrated circuit, not only the original test programming from test sequence 120.

For the remainder of this description, all references to waveform viewers can use the term waveform viewer whether the waveform viewer is the sole display device in the system or whether the waveform viewer is sharing the outputs with additional devices or systems, unless otherwise indicated.

A further important distinguishing feature of system 100 is that the derived code is independent of the waveform tool. That is, the new code can go to the waveform viewer 170 for viewing or it can return to the test sequence 120 or be inserted at simulation test bench 160. It is not a requirement that the code go to the system 100 waveform viewer first. Other waveform viewers or visual apparatus can accept the output code. The user can select to pre-program the system 100 to bypass the waveform viewer or can select this option in real-time mode.

In the system 100, the software coding can be written in user specified language such as Verilog HDL or in very high speed integrated circuit description language (VHDL). Verilog HDL is a user specified language used to design and document electronic systems. Verilog HDL allows designers to design at various levels of abstraction. VHDL is another example of user specified language. VHDL was developed by the Institute of Electrical and Electronics Engineers (IEEE).

Further disclosed is waveform viewer 170 wherein USL calculates and determines the type and quality of the signal. The significant advantage to stimulating the IC 110 through the test sequence 120 device is in confirming initial cell driver 135 device input with the expected cell receiver 145 device output. If there is a subsequent mismatch, the code is manipulated directly in the waveform viewer 170 software. The revised USL code is transmitted via the waveform viewer bus 165 from the assertion behavior code modification generator (ABCMG) 180 in FIG. 2 and displayed on waveform viewer 170.

Figure 2:
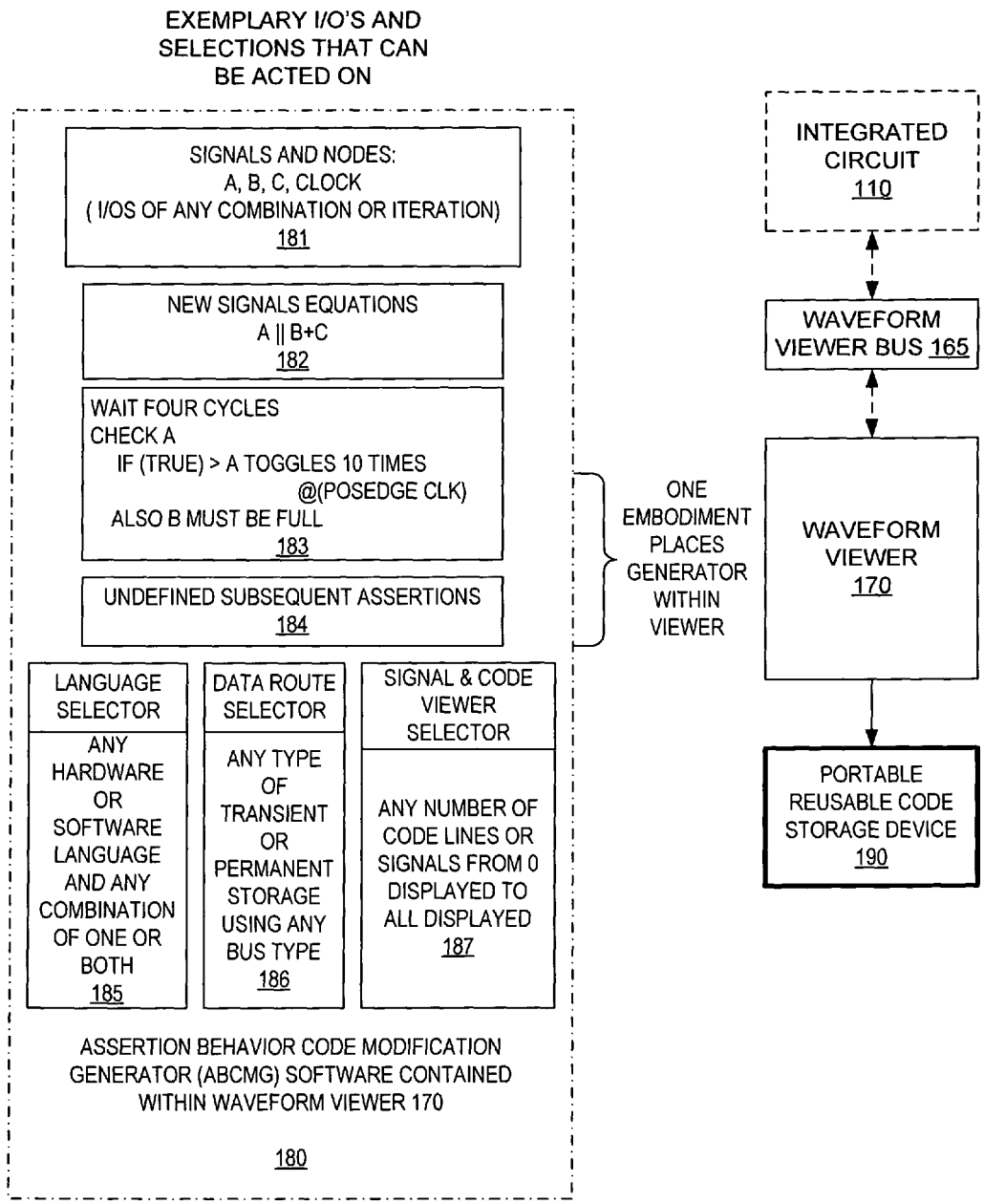
FIG. 2 illustrates the assertion behavior modification generator and waveform viewer in one embodiment of the invention.

Turning to FIG. 2, disclosed is an assertion behavioral code modification generator (ABCMG) 180. The purpose of the ABCMG 180 is to receive software code via the waveform viewer bus 165 and modify it according to the software logic within the ABCMG 180. The ABCMG 180 then returns the processed software code to the waveform viewer 170 via the waveform viewer bus 165 for viewing. The viewed code can be output to the test sequence 120, the simulation test bench 160, discarded, or placed in a portable reusable code portable reusable coded storage device 190.

The ABCMG 180 can be embodied within the waveform viewer 170, within a remote or separate waveform viewer, incorporated within a separate hardware or software device, or contained independently in its own device.

Device 181 is exemplary of an input or output of signals and nodes. Device 182 is exemplary of an input or output of new signals equations. Device 183 is exemplary of an input or output assertion. Device 184 is exemplary of an undefined subsequent assertion. Device 185 is exemplary of a language selector, capable of selecting one or more languages, coded in software or in hardware, of any combination, for processing new lines of assertion code. Device 186 is exemplary of a data route selector, selectively routing data by any type of bus to any type of storage medium or device. Device 187 is exemplary of a signal and code waveform viewer selector, permitting a user to select a range of code lines to display or a range of signals to display. The ranges vary from zero (no display) to infinite (all).

The ABCMG 180 logic is software that is programmed with assertion algorithms and modified Boolean algebraic arguments. Assertions are statements of fact assumed true. Algorithms are the mathematical expression of the logical relationship between two or more assertions. Boolean algebra assesses only binary combinations, a form of algebra concerned with the logical functions of variables that are restricted to two values, true or false. Boolean algebra is fundamental to all digital circuit design. Generally, the Boolean algebra is logically fixed and stable. Distinguishing the ABCMG 180 logic is the ability of the software to accept modified code from the waveform viewer 170 and modify the previous Boolean algebraic truth tables (list of true and false statements).

The purposes of the ABCMG 180 include conveying signals, from the success or failure of the tested events, identifying each event or an assertion, and reporting the total, visually, through the waveform viewer bus 165 to waveform viewer 170.

There are distinct advantages of driving IC 110 with the USL modifications and visualizing the real-time results at waveform viewer 170. One advantage is the ability to select an endless loop execution of the modified code. With no user intervention, the modified code can recycle until no more error codes are asserted. Another advantage is that the user can terminate the loop manually at a precisely predetermined point to insert manually modified code from the waveform viewer 170 controls or another source. The completed test designs and the associated software code are stored in portable reusable code storage device 190. Those stored codes can be transported intact, without further modification, to additional IC architectures. There is an assurance that the IC 110 is fully tested and functional. Reliability is increased and manual re-coding is decreased. The two results lead to reduced time to completion of subsequent projects utilizing the tested device.

Furthermore, the completed device can be inserted in subsequent test bench devices, with a high level of confidence that the insertion will test only the new IC 110 properties. Development time of increasingly complex register transfer level design (RTL) is considerably shortened.

In the system 100, all signals and their associated waveforms, and their respective code lines, and including the synthesized code (resident in the portable reusable code storage device or within the bus), are displayed, user selectable, on the waveform viewer 170. The ABCMG 180, in one embodiment, can be contained wholly within a logic device residing at waveform viewer 170. This embodiment is possible because the assertion algorithms within ABCMG 180 are designed to select and use one or more computer programming languages from a suite of programming languages. Different data paths are selectable, as are the output signal waveforms. The user can select one or more lines of code and perform specified operations within the line. All of these variables can be manipulated independently and simultaneously while displaying the results.

Illustrated in FIG. 3 are representative samples of waveforms and software code lines displayed on waveform viewer 170. The displayed waveforms can contain the original waveforms from a first test pass on the IC 110 and subsequent test passes. The waveform viewer 170 can display the original code lines from the USL or the modified code lines. The waveform viewer 170 can display the saved ABCMG 180 output files. The waveform viewer 170 can also display the individual test node signals from the IC 110 and any other ICs connected to the test bench.

When the ABCMG 180 is invoked, depending on user selection, a popup menu, workspace, window, or waveform window can appear or transform into a different work outline window, containing assertion or event creation capabilities. The windows or sub-screens for the waveform viewer 170 are contained in pre-programmed software in the waveform viewer. The menus, workspaces, windows and associated waveform viewer elements are derived from software code and hardware contained within and essential to operation of the waveform viewer device.

Use of the ABCMG 180 to create new signals, assertions, and events (SAEs) options, observing counts, selecting specified SAEs, manipulating selected SAEs, creating compound or complex SAEs and visually observing results, can be independent of the original design programming of the IC 110. The purpose of the entire test bench is to test device designs and assumptions. If one or more of a number of design elements or assumptions fails, rewriting one or more SAEs allows the test procedure to continue unabated. Previously, a failure of any element of the IC 110 required removing the device and manually changing the physical gates or the programmed logic.

Furthermore, the code generator 180 allows for the selective use of one or more programming language sets (for example, generic [machine or assembly], standard [USL, VUSL, C, and so on,], and specific to the simulator) for the visual display in the waveform viewer 170 or automated tasks, whether applied to specific SAEs or when creating new SAEs.

In this example, the simulation results of a particular test case run on an IC 110 are displayed by means of waveforms displayed on waveform viewer 170's screenshot in FIG. 3. Two events are identified, Event X and Event Y. Event X consists of a signal 'Sig A' and signal 'Sig B' logically ORed together. 'Sig C' is an independent signal that can represent an AND gate. Event X is Event Y inverted and latched at the posedge (positive edge) of the clock. Additional complex events displayed in the waveform viewer are "every_request_gets_a_grant" and counters, Count_X and Count_Y, and Event_Z. The function of this assertion, in this example, is to report events as a result of the pass or failure of the properties under the test procedure protocol. The question asked by the logic is, "Did 'A' or 'B' receive or not receive a grant for each request?" Generally, at least one logical assertion is derived from the ABCMG 180. Event_Z then compares the results of the logical relationship between Sig A and Sig B. Event counters complement these events by storing results in the counter, and these results can be used to derive additional assertion code based on limiters and delimiters to the actual numeric count.

The stored files contained on storage medium internal to waveform viewer 170, or held externally in a portable reusable code storage device 190, can be updated directly through indicia received via waveform viewer bus 165, through ABCMG 180, or through the portable reusable coded storage device 190.

Turning now to FIG. 4, illustrated are the generated events monitors and assertions, as would typically be coded manually in conventional coding schemes, in the Verilog (Cadence Design Systems) and Sugar (IBM) user specified languages. In the system 100, USL, programming code, or recompiled USL code is an option displayable on the waveform viewer. The user can specify as to the total number of signals reported.

Figure 5:
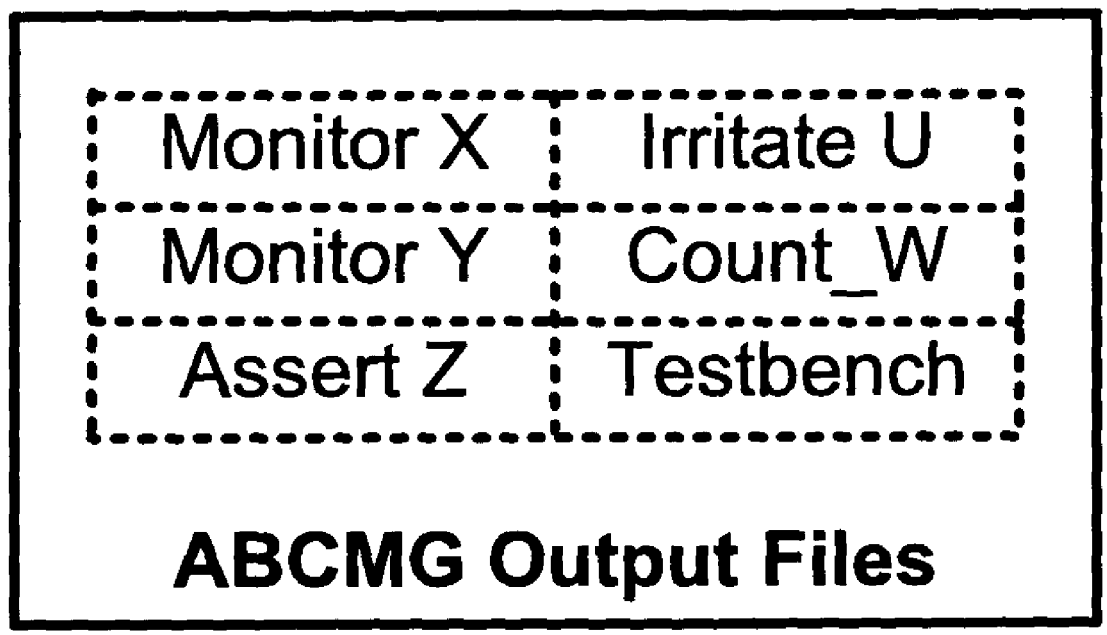
FIG. 5 is an example of the re-incorporated simulation test bench generated code.

Turning now to FIG. 5, illustrated is resultant output from the assertion behavior code modification generator 180. The generator drives the simulation test bench, thereby inducing changed states within the integrated circuit. These changed states are reporting changes to the waveform viewer 170 in a plurality of time selectable modes, with user selectable options of storing the resultant code, pre- or post-simulation.

The techniques and mechanisms described in the system 100 are illustrated as implemented on a computer executing the Microsoft Windows NT operating system using C++ programming language. However, the techniques and mechanisms are not limited to any particular hardware or software configuration, but rather they can find applicability in any computing environment in which automated computer simulated hardware verification is desired. These techniques and mechanisms can be implemented in hardware or software, or a combination of the two. Preferably, implementation is achieved with computer programs executing on programmable computers that each include a processor, a storage medium readable by the processor (including volatile and non-volatile memory and/or storage elements), and suitable input and output devices. Program code is applied to data entered using the input device to perform the functions described and to generate output information. The output information is applied or reapplied to one or more physical devices. Each such computer program is preferably stored on a storage medium or device (for example, CD-ROM, hard disk or magnetic diskette) that is readable by a general or special purpose programmable computer for configuring and operating the computer when the storage medium or device is read by the computer to perform the procedures described in this document. The system also can be implemented as a computer-readable storage medium, configured with a computer program, where the storage medium so configured causes a computer to operate in a specific and predefined manner.

The invention can be implemented in digital electronic circuitry, or in computer hardware, firmware, software, or in combinations of them. Apparatus of the invention can be implemented in a computer program product tangibly embodied in a machine-readable portable reusable coded storage device for execution by a programmable processor; and method steps of the invention can be performed by a programmable processor executing a program of instructions to perform functions of the invention by operating on input data and generating output.

The invention can also be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language or in assembly or machine language if desired; and, in any case, the language can be a compiled or interpreted language. Suitable processors include, by way of example, both general and special purpose microprocessors. Generally, a processor will receive instructions and data from a read-only memory and/or a random access memory. Portable reusable coded storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CD-ROM disks. Any of the foregoing can be supplemented by, or incorporated in, specially-designed ASICs (ASICs are integrated circuits custom manufactured for a specific task or application).

It is understood that the present invention can take many forms and embodiments. Accordingly, several variations can be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention can be employed without a corresponding use of the other features. Many such variations and modifications can be considered desirable by those skilled in the art based upon a review of the foregoing description of preferred embodiments. Accordingly, it is appropriate that the appended claims be construed broadly and in a manner consistent with the scope of the invention.

The invention claimed is:

1. A system for dynamically configuring and testing integrated circuit device specifications, comprising:
    an assertion behavior code modification generator;
    an integrated circuit device embedded in a simulation test bench;
    a portable reusable code storage device;
    a waveform viewer;
    a test sequence device controlled through a command generated through the waveform viewer, wherein:
    the test sequence device is coupled to the integrated circuit device;
    the waveform viewer is coupled to the portable reusable code storage device;
    an interface is coupled between the waveform viewer and the assertion behavior code modification generator wherein the assertion behavior code modification generator contained within the waveform viewer; and the waveform viewer is further connected to the integrated circuit device.

2. The system of claim 1, wherein the integrated circuit device has a plurality of inputs and outputs.

3. The system of claim 1, wherein the integrated circuit device is coupled to the waveform viewer.

4. The system of claim 1, wherein a bus coupled between the waveform viewer and the integrated circuit, is employed to carry indicia of a dynamically changed state from the test bench, wherein the indicia is a function of the output of the assertion behavior code modification generator.

5. The system of claim 1, wherein the assertion behavior code modification generator routes processed software code to a plurality of input devices.

6. The system of claim 5, wherein the waveform viewer has an interface for displaying waveforms, user specified language lines and the contents of the portable reusable code storage device.

7. The system of claim 1, wherein the assertion behavior code modification generator is configured to generate user specified language code as it receives new data inputs.

8. The system of claim 7, wherein the form of the interface is responsive to user selection.

9. The system of claim 8, wherein the means for testing the integrated circuit is responsive to selection from the output of the waveform viewer by a user of the waveform viewer.

10. The system of claim 7, wherein the means for generating the user specified language comprises:
a means for synthesizing a user specified language description of the integrated circuit digital design through employment of the assertion behavior code modification generator.

11. The system of claim 10, wherein the means for creating and manipulating signals or behaviors within the test apparatus is user defined.

12. The system of claim 1, wherein the portable reusable code storage device is configured to accept one or more code sequencing results.

13. A visual implemented method of generating and manipulating user specified language simulation code, the method comprising:
initializing code generator data structures that control code executions;
initializing an integrated circuit;
comparing a plurality of output signal statements within an assertion behavior code modification generator;
receiving additional constraint parameters from a code generator contained within a waveform viewer through a bus;
receiving additional constraint parameters from a waveform viewer user through the bus;
viewing signal outputs from an integrated circuit;
manipulating signal outputs from an integrated circuit;
compiling user specified language from one or more integrated circuit test results;
revising at least one data instruction based at least, in part, on revised constraint parameters to a user specified language simulation code;
re-examining the data signals and associated code lines within the waveform viewer;
re-coding the user specified language simulation code for driving a test bench containing an integrated circuit; and
employing user specified language by means of a portable reusable coded storage device.

14. The method of claim 13, further comprising continuously looping signal code outputs through the integrated circuit.

15. The method of claim 13, further comprising grouping and displaying a plurality of user specified language lines on a waveform viewer.

16. The method of claim 13, further comprising a display within the waveform viewer of lines of user specified language residing in a portable reusable code portable reusable coded storage device.

17. The method of claim 13, further comprising incrementing a signal count.

18. The method of claim 13, further comprising decrementing a cell check count.

19. The method of claim 13, further comprising employing a portable reusable storage code device.

20. The method of claim 13, further comprising using an assertion code algorithm.

21. A computer program for a waveform viewer implemented method of generating and manipulating user specified language simulation code, the waveform viewer including a computer program comprising:
computer code for initializing assertion behavior code modification generator data structures that control code executions;
computer code for initializing an integrated circuit;
computer code for comparing a plurality of output signal statements within an assertion behavior code modification generator contained within the waveform viewer;
computer code for receiving additional constraint parameters from the assertion behavior code modification generator contained within the waveform viewer through a bus;
computer code for receiving additional constraint parameters from a waveform viewer user through the bus;
computer code for viewing signal outputs from an integrated circuit;
computer code for manipulating signal outputs from an integrated circuit;
computer code for compiling user specified language from one or more integrated circuit test results;
computer code for revising at least one data instruction based at least, in part, on revised constraint parameters to a user specified language simulation code;
computer code for re-examining the data signals and associated code lines within the waveform viewer;
computer code for re-coding the user specified language simulation code for driving a test bench containing an integrated circuit; and
computer code for employing user specified language by means of a portable reusable coded storage device.

22. A system for dynamically configuring and testing integrated circuit device specifications, comprising:
a waveform viewer coupled, via a waveform viewer bus, to an integrated circuit under test, for displaying visual output of user-specified language (USL) code, the visual output representing tested events or assertions;
an assertion behavior code modification generator (ABCMG) coupled to the waveform viewer bus and contained within the waveform viewer, the ABCMG comprising software logic for receiving USL code via the waveform viewer bus, modifying the USL code, and returning the modified USL code to the waveform viewer for display;
the system further comprising:

a test sequence device coupled to the waveform viewer, the test sequence device containing a sequencing program residing in preprogrammed memory, and issuing a series of command control instructions from the sequencing program, the test sequencing device being coupled to a management port driver and a cell driver;

the management port driver and the cell driver being coupled to the integrated circuit under test, and operable to pass input signals derived from the preprogrammed sequencing program to the integrated circuit under test;

a cell queue coupled to the cell driver, operable to store reference input signals applied to the integrated circuit under test;

a cell receiver coupled to the integrated circuit under test, and operable receive output signals from the integrated circuit under test;

a cell checker coupled to the cell receiver and to the cell queue, and operable to cache, verify and compare output signals from the cell receiver with reference input signals from the cell driver as stored in the cell queue; and a portable reusable code storage device, coupled to the waveform viewer, for storing modified USL code;

wherein the waveform viewer displays input signals and corresponding output signals together with USL code, and wherein the ABCMG conveys signals representing success or failure of a tested event, identifies each event or assertion, visually reports a total to the waveform viewer, cooperates with the waveform viewer to modify USL code, and stores modified USL code in a memory or in the portable reusable code storage device.

* * * * *